United States Patent [19]

Nicholas et al.

[11] 4,062,660

[45] Dec. 13, 1977

[54] METHOD OF PRODUCING NICKEL COATED DIAMOND PARTICLES

[76] Inventors: Michael G. Nicholas, 6, Bryan Way, Wantage, Berkshire; Peter M. Scott, "Skagway", Peasemore, Newbury, Berkshire, both of England; Bruce I. Dewar, 43 Walmer Street, Johannesburg, 2001, South Africa

[21] Appl. No.: 685,751

[22] Filed: May 13, 1976

Related U.S. Application Data

[63] Continuation of Ser. No. 461,213, April 15, 1974, abandoned.

[30] Foreign Application Priority Data

Apr. 16, 1973 United Kingdom .............. 18268/73

[51] Int. Cl.$^2$ ............................................. B24D 3/06
[52] U.S. Cl. .................................... 51/295; 51/309 R
[58] Field of Search ................. 51/295, 298, 297, 308, 51/309

[56] References Cited

U.S. PATENT DOCUMENTS

| 2,716,404 | 8/1955 | Taeyaerts | 51/309 |
| 3,316,073 | 4/1967 | Kelso | 51/295 |
| 3,663,191 | 5/1972 | Kroder | 51/295 |
| 3,841,852 | 10/1974 | Wilder et al. | 51/295 |
| 3,924,031 | 12/1975 | Nicholas | 51/295 |

FOREIGN PATENT DOCUMENTS

| 1,296,070 | 5/1969 | Germany | 51/295 |

*Primary Examiner*—Donald J. Arnold

[57] ABSTRACT

A method of bonding diamond to a metal capable of dissolving carbon but not of forming stable carbides under normal temperature and pressure conditions, preferably nickel, which includes the step of intimately contacting the diamond with the metal to form a composite structure and heat treating the composite structure at a temperature above 500° C but below the melting temperature of metal, both steps being carried out in a non-oxidizing atmosphere.

1 Claim, No Drawings

METHOD OF PRODUCING NICKEL COATED DIAMOND PARTICLES

This is a continuation of application Ser. No. 461,213, filed Apr. 15, 1974, now abandoned.

This invention relates to the metal coating of diamond.

Very extensive use is made of diamond in abrasive tools such as crowns, single point tools, resin and metal bond wheels, saws and compacts. Considerable amount of research has gone into improving the bonding properties of the diamond to the matrices of these tools as a poor bond at the diamond/matrix interface leads to dislodgement of the diamond from the matrix during the abrading operation. This research has led to the development of metal coated diamond particles which find application particularly in resin bond wheels. Such metal coated particles have been found to have retention properties in resin bond wheels which are superior to unclad diamond particles. However research continues in an effort to improve the bond strength of the metal/diamond interface, thereby to improve the retention properties of diamond in the matrices of abrasive tools.

It is an object of this invention to provide a method of bonding diamond to certain metals which provides a strong interfacial bond between the diamond and metal.

According to the invention, a method of bonding diamond to a metal capable of dissolving carbon but not of forming stable carbides under normal temperature and pressure conditions includes the steps of intimately contacting the diamond with the metal to form a composite structure and heat treating the composite structure at a temperature above 500° C but below the melting temperature of the metal, both steps being carried out in a non-oxidising atmosphere. This method has surprisingly been found to result in interfacial bond strengths which are greater than those attributable to physical forces only. Suitable metals which have the properties defined above are nickel, cobalt and iron.

The non-oxidising atmosphere may be provided by helium, argon, hydrogen, nitrogen or a vacuum of the order of $10^{-2}$mm Hg or better.

In the case of massive diamond objects, e.g. plaques, the intimate contact may be achieved by contacting the diamond with the metal and then applying pressure to deform the metal.

In the case of diamond particles such as grit, the intimate contact may be achieved by coating the particles using standard electroless or electrolytic or vacuum deposition techniques. Vacuum deposition techniques are well known in the art and descriptions of them can be found in such references as "Vacuum Deposition of Thin Films" by L. Holland, Chapman and Hall, 1st Editon 1956. Vacuum depositon techniques are preferred because they produce very pure metal coatings. It has been found that the bonding strength is impaired if impurities are present. Any temperature above the 500° C and below the melting point of the metal can be used. The upper limit is preferably about 50° C below the melting point of the metal. Where high melting metals are used the temperature is preferably maintained below the graphitisation temperature of diamond.

When the diamond is in the form of grit, the grit may be of the RD, SD or MD type for application in resin bond or metal bond wheels, saws, compacts, crowns or single point tools. In particular, it has been found that saws incorporating diamonds coated by the method of the invention show improved properties over saws incorporating coated diamonds of the prior art.

The amount of metal in the coating will dry according to the type of particle and the application to which the particle is to be put. The coating will generally consist of a thin layer on the diamond surface which has been bonded thereto by means of the method described above and a thicker layer deposited on the thin layer by any of the well known techniques mentioned above. The thin and thicker layers may consist of the same metal or of different metals which alloy.

It has been found that the bond strength achieved varies with time and temperature of heat treatment. In the case of nickel, preferred conditions are 2 hours heat treatment at 800° C.

Further according to the invention there is provided a method of increasing the diamond/metal interfacial bond strength of a diamond particle coated with a metal capable of dissolving carbon but not of forming stable carbides under normal temperature and pressure conditions including the step of heat treating the coated particle at a temperature above 500° C but below the melting temperature of the metal in a non-oxidising atmosphere.

The invention will be illustrated by the following nonlimitative Examples.

EXAMPLE 1.

Pure nickel was swaged into an ingot of a desired diameter, e.g. 1,5 mm, and the ingot was then cut into desired lengths.

A length was placed on a diamond plaque which in turn rested on a graphite anvil in a chamber consisting of a quartz tube clamped between water cooled top and bottom brass plates. The chamber was evacuated by a rotary pump to $10^{-2}$mm Hg or better pressure and maintained at this pressure during heating. A silica piston entered the vacuum chamber through a Wilson seal in the top plate and was used to apply pressure to the sample on the anvil. The pressure applied was sufficient to provide intimate contact between the nickel and the diamond, i.e. a pressure of between 3 and about 7,5 kg/mm$^2$. Induction heating was then used to raise the temperature of the chamber to 800° C which was maintained for about 2 hours. Excellent solid phase bonding of the nickel to diamond resulted with a bond strength of 25,8 kg/mm$^2$ being obtained. The bond strength, i.e. interfacial tensile strength, was measured in a standard manner using a shearing jig to which was attached a Hounsfield tensometer.

EXAMPLE 2

This example illustrates the dependency of the metal/diamond interfacial bond strength on time of heat treatment. The procedure adopted was the same as that in Example 1, except that in a first case the heat treatment was for 30 minutes and in a second case the heat treatment was for 16 hours. The interfacial bond strengths obtained were 12.5 kg/mm$^2$ in the first case and 8,8 kg/mm$^2$ in the second.

EXAMPLE 3

A diamond plaque sas taken and a thin layer of nickel deposited thereon by vacuum deposition techniques described in the Holland reference. This was followed by a heat treatment similar to that described in Example 1. A nickel overlayer was then electrolytically deposited on the layer. The diamond/nickel interfacial bond strength was found to be 22 kg/mm².

EXAMPLE 4

For purposes of comparing the bonding of the invention with that of the prior art the following experiments were conducted:

i. a layer of nickel was deposited on a diamond plaque using an electroless deposition technique of the prior art. This was not followed by any heat treatment. Attempts were made to measure the interfacial bond strength using a Hounsfield tensometer, but the strength was too low to be measured, and was effectively 0 kg/cm².

iii. A thin film of nickel was deposited on a plaque using vacuum deposition techniques as decribed in the Holland reference mentioned above. The coated plaque ws not subjected to heat treatment in accordance with the invention. Once again the bond strength was very low, being less than 1 kg/cm².

EXAMPLE 5

40 – 50 mesh SD diamond grit was coated with a layer of nickel using known vacuum deposition techniques described in the Holland reference mentioned above. A layer amounting to 1 to 2 percent by weight of the uncoated particle waas deposited. The coated particles were then heat treated at a temperature of 800° C for 2 hours in a vacuum furnace ($10^{-2}$ mm Hg pressure). A layer of nickel was then deposited on the treated grit using known electroless deposition techniques. The outer layer amounted to 20% by weight of the original coated grit.

For purposes of comparison, nickel coated grit was prepared as above, omitting the heat treatment step of the invention, i.e. prior art coated grit.

The two types of coated grit were incorporated in saws and sawing tests carried out. It was found that the saw containing the grit coated in accordance with the invention showed less wear than the saw containing the prior art coated grit.

We claim:

1. A method of producing nickel coated diamond particles including the steps of providing a batch of individual, discrete uncoated particles, depositing a nickel coating on the individual particles and then heat treating the coated particles to a temperature of about 800° C for about 2 hours to produce a batch of individual, discrete nickel coated diamond particles, the deposition and heating steps being carried out in a non-oxidising atmosphere.

* * * * *